(12) United States Patent
Jang

(10) Patent No.: US 11,233,223 B2
(45) Date of Patent: Jan. 25, 2022

(54) STRUCTURE FOR EXTRACTING LIGHT AND ORGANIC ELECTROLUMINESCENT LIGHTING DEVICE

(71) Applicant: CHEOMDANLAB INC., Gwangju (KR)

(72) Inventor: Ha Jun Jang, Gwangju (KR)

(73) Assignee: CHEOMDANLAB INC., Gwangju (KR)

( * ) Notice: Subject to any disclaimer, the term of this patent is extended or adjusted under 35 U.S.C. 154(b) by 59 days.

(21) Appl. No.: 16/634,801

(22) PCT Filed: Sep. 7, 2018

(86) PCT No.: PCT/KR2018/010460
§ 371 (c)(1),
(2) Date: Jan. 28, 2020

(87) PCT Pub. No.: WO2020/045719
PCT Pub. Date: Mar. 5, 2020

(65) Prior Publication Data
US 2021/0066664 A1    Mar. 4, 2021

(30) Foreign Application Priority Data

Aug. 29, 2018 (KR) .................... 10-2018-0102180

(51) Int. Cl.
*H01L 51/56* (2006.01)
*G02B 5/02* (2006.01)
*H01L 51/52* (2006.01)

(52) U.S. Cl.
CPC .......... *H01L 51/5268* (2013.01); *G02B 5/021* (2013.01); *G02B 5/0247* (2013.01); *G02B 5/0278* (2013.01)

(58) Field of Classification Search
CPC ..... H01L 51/5268; H01L 51/52; H01L 51/56; H01L 2251/5361; G02B 5/021; G02B 5/0278; G02B 5/0221; G02B 5/0247
See application file for complete search history.

(56) References Cited

U.S. PATENT DOCUMENTS

| 7,420,739 B2 | 9/2008 | Kim et al. |
| 8,890,133 B2 | 11/2014 | Allano et al. |
| 2005/0231106 A1 | 10/2005 | Tanaka et al. |

(Continued)

FOREIGN PATENT DOCUMENTS

| JP | 2002-033002 A | 1/2002 |
| JP | 2017-069167 A | 4/2017 |

(Continued)

OTHER PUBLICATIONS

Translation of JP2002033002A (Masuda et al.) (Feb. 3, 2002). (Year: 2002).*

*Primary Examiner* — Caridad Everhart
(74) *Attorney, Agent, or Firm* — Novick, Kim & Lee, PLLC; Jae Youn Kim

(57) ABSTRACT

A structure for extracting light, which improves light extraction efficiency by enhancing a scattering effect and improves power efficiency and thus increases the lifetime of an organic electroluminescent lighting device, is provided, and an organic electroluminescent lighting device including the structure for extracting light is also provided.

10 Claims, 10 Drawing Sheets

(56) References Cited

U.S. PATENT DOCUMENTS

2009/0153972 A1\* 6/2009 Nakamura ................ C03C 3/21
359/599
2015/0323711 A1 11/2015 Bessho et al.

FOREIGN PATENT DOCUMENTS

KR 10-0737979 B1 7/2007
KR 10-2013-0097744 A 9/2013

\* cited by examiner (a) (b)

(a) (b)

(a)  (b)

STRUCTURE FOR EXTRACTING LIGHT AND ORGANIC ELECTROLUMINESCENT LIGHTING DEVICE

TECHNICAL FIELD

The present disclosure relates to a structure for extracting light and an organic electroluminescent lighting device.

BACKGROUND ART

An organic light-emitting device has recently increased in utilization in that it may be flexibly implemented as a self-luminescent device.

The organic light-emitting device is mainly used as a display device having a plurality of pixels to implement an image.

When the organic light-emitting device is used as a surface luminescent lighting device, since light generated in an emission layer has to pass through many interfaces until the light is emitted to a light extraction surface, there is a lot of light loss in this process, and thus, light extraction efficiency may be lowered. This lowering in light extraction efficiency increases power consumption, which in turn has the side effect of reducing the lifetime of the lighting device.

DESCRIPTION OF EMBODIMENTS

Technical Problem

In order to solve the problem that light extraction efficiency is lowered in an organic electroluminescent lighting device, as described above, an embodiment provides a structure for extracting light and an organic electroluminescent lighting device, which have high light extraction efficiency and improved power efficiency.

Solution to Problem

According to an aspect of the present disclosure, a structure for extracting light includes a base substrate having a first surface and a second surface opposed to each other, the base substrate being provided such that light enters the first surface and exits through the second surface, and a plurality of pores irregularly distributed in the base substrate, wherein the base substrate scatters the light when the light passes through the base substrate, wherein the scattering includes a first scattering by the pores and a second scattering by at least one of the first surface or the second surface, and a first scattering degree by the first scattering and a second scattering degree by the second scattering have a relative difference.

When the first scattering degree by the first scattering is greater than the second scattering degree by the second scattering, the average total transmittance of the base substrate with respect to a wavelength of the light may be 70% or more.

When the second scattering degree by the second scattering is greater than the first scattering degree by the first scattering, the average total transmittance of the base substrate with respect to a wavelength of the light may be less than 70%.

When the first scattering degree by the first scattering is greater than the second scattering degree by the second scattering, the pores may have a first diameter, and when the second scattering degree by the second scattering is greater than the first scattering degree by the first scattering, the pores may have a second diameter, wherein the first diameter may be greater than the second diameter.

When the first scattering degree by the first scattering is greater than the second scattering degree by the second scattering, at least one of the first surface and the second surface may have a first roughness, and when the second scattering degree by the second scattering is greater than the first scattering degree by the first scattering, at least one of the first surface and the second surface may have a second roughness, wherein the second roughness may be greater than the first roughness.

According to another aspect of the present disclosure, an organic electroluminescent lighting device includes a substrate, a sealing member coupled to the substrate, an organic light-emitting portion between the substrate and the sealing member and sealed by the substrate and the sealing member, and a light extraction film positioned at a side from which light emitted from the organic light-emitting portion is taken out, the light extraction film including a base substrate having a first surface and a second surface opposed to each other, and a plurality of pores irregularly distributed in the base substrate, wherein the base substrate is provided such that light enters the first surface and exits through the second surface, wherein the base substrate scatters the light when the light passes through the base substrate, wherein the scattering includes a first scattering by the pores and a second scattering by at least one of the first surface or the second surface, and a first scattering degree by the first scattering and a second scattering degree by the second scattering have a relative difference.

When the first scattering degree by the first scattering is greater than the second scattering degree by the second scattering, the average total transmittance of the base substrate with respect to a wavelength of the light may be 70% or more.

When the second scattering degree by the second scattering is greater than the first scattering degree by the first scattering, the average total transmittance of the base substrate with respect to a wavelength of the light may be less than 70%.

When the first scattering degree by the first scattering is greater than the second scattering degree by the second scattering, the pores may have a first diameter, and when the second scattering degree by the second scattering is greater than the first scattering degree by the first scattering, the pores may have a second diameter, wherein the first diameter may be greater than the second diameter.

When the first scattering degree by the first scattering is greater than the second scattering degree by the second scattering, at least one of the first surface or the second surface may have a first roughness, and when the second scattering degree by the second scattering is greater than the first scattering degree by the first scattering, at least one of the first surface or the second surface may have a second roughness, wherein the second roughness may be greater than the first roughness.

Advantageous Effects of Disclosure

According to the embodiments of the disclosure as described above, light extraction efficiency may be improved.

As an organic electroluminescent lighting device, high power efficiency may be achieved, thereby increasing the lifetime of the organic electroluminescent lighting device.

MODE OF DISCLOSURE

Figure 1:
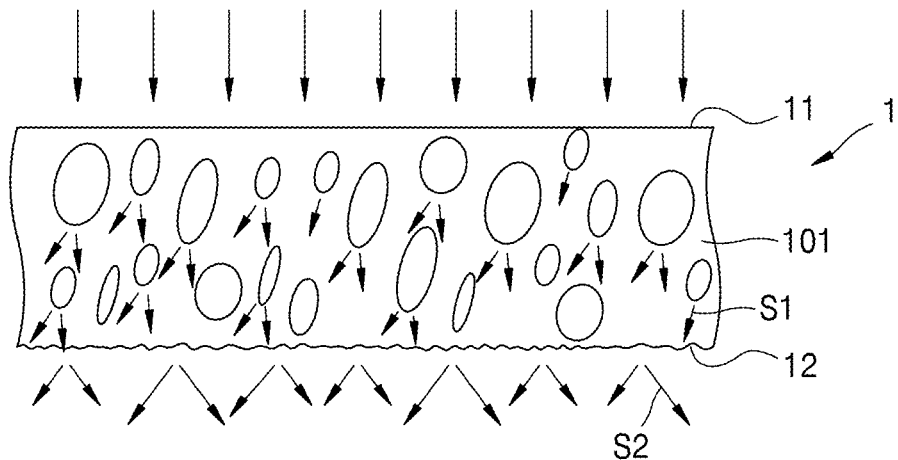
FIG. 1 is a schematic cross-sectional view of a light extraction structure according to an embodiment.

The present disclosure may include various modifications and different embodiments. In this regard, specific embodiments are illustrated in the drawings and will be described in detail. Advantageous effects, features, and methods for achieving the effects and features will become more apparent by explaining the embodiments in detail with reference to the accompanying drawings. However, the present disclosure is not limited to these embodiments but may be implemented in various modes.

The embodiments of the present disclosure will now be described in detail with reference to the accompanying drawings, in which like reference numerals denote like elements, and thus their description will be omitted.

As used herein, the singular forms "a", "an" and "the" are intended to include the plural forms as well, unless the context clearly indicates otherwise.

It will be further understood that the terms "comprises" and/or "comprising," or "includes" and/or "including" when used in this specification, specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

When it is possible to modify an embodiment, the order of processes may be different from the order in which the processes have been described. For instance, two processes described as being performed sequentially may be substantially performed simultaneously or in a reverse order.

In the drawings, the size of elements may be exaggerated or reduced for clarity. For instance, the size and thickness of each element may be arbitrarily illustrated in the drawings, and therefore, the present disclosure is not limited to the drawings.

FIG. 1 is a schematic cross-sectional view of a structure 1 (hereinafter, referred to as a light extraction structure 1) for extracting light according to an embodiment.

Referring to FIG. 1, the light extraction structure 1 according to the embodiment may include a base substrate 101 and a plurality of pores 102 irregularly distributed in the base substrate 101.

The base substrate 101 may include a light transmissive polymer material. According to an embodiment, the base substrate 101 may include polyimide. The base substrate 101 may be flexible.

The base substrate 101 may have a first surface 11 and a second surface 12 opposed to each other. In this case, the first surface 11 may be an incident surface on which light is incident, and the second surface 12 may be an exit surface from which light exits. Therefore, light may enter the base substrate 101 through the first surface 11 and exit through the second surface 12.

The plurality of pores 102 may be irregularly distributed between the first surface 11 and the second surface 12 of the base substrate 101. The pores 102 may function as scattering particles of light, may form voids in which the insides thereof are empty, and may have a refractive index of air in the voids.

The base substrate 101 as described above may scatter light when the light passes through the base substrate 101.

The scattering may include a first scattering S1 by the pores 102 and a second scattering S2 by at least one of the first or second surfaces 11 and 12.

The light passing through the base substrate 101 hits pores 102 irregularly arranged on the path of the light, and due to the difference in refractive index between air forming the pores 102 and polymer constituting the base substrate 101, the light is scattered. This first scattering S1 may include Mie scattering. The first scattering S1 may form light scattering in a form in which most of the first scattering S1 spreads in a direction in which light spreads out.

The light passing through the base substrate 101 may be scattered (the second scattering S2) by at least one of the first surface 11, which is the incident surface, or the second surface 12, which is the exit surface. In an embodiment, the second scattering S2 may include scattering formed by the second surface 12. The second scattering S2 may include surface scattering. In the second scattering S2, the scattered light may spread in a direction other than the progressing direction of the light as well as the progressing direction and spread in lateral direction.

The light extraction structure 1 according to the embodiment may be provided such that a first scattering degree by the first scattering S1 and a second scattering degree by the second scattering S2 have a relative difference. That is, the light extraction structure 1 according to the embodiment may be provided such that the first scattering degree by the first scattering S1 is greater than the second scattering degree by the second scattering S2 according to required optical characteristics. The light extraction structure 1 according to another embodiment may be provided such that the second scattering degree by the second scattering S2 is greater than the first scattering degree by the first scattering S1 according to required optical characteristics.

According to an embodiment, in the light extraction structure 1, when the first scattering degree by the first scattering S1 is greater than the second scattering degree by the second scattering S2, the average total transmittance of the base substrate 101, that is, the light extraction structure 1, with respect to the wavelength of the light may be 70% or more. In this case, the average total reflectance of the base substrate 101 with respect to the wavelength of the light may be less than 20%. The average total transmittance with respect to the wavelength of the light may correspond to the average value of the total integrated transmittance that appears when the wavelength of the light is changed. The average total reflectance with respect to the wavelength of the light may correspond to the average value of the total integrated reflectance that appears when the wavelength of the light is changed.

As such, when the first scattering degree by the first scattering S1 is greater than the second scattering degree by the second scattering S2, the light extraction structure 1 may have high transparency and low reflectance. In addition, in this case, the average haze value for the wavelength of light may be about 80% or more, and thus, high diffusivity may be obtained, and a change in luminance according to a viewing angle may be reduced, thereby achieving Lambert emission. In addition, a change in color coordinates according to the viewing angle may be reduced. In addition, when the light extraction structure 1 is attached to a lighting device, the light extraction efficiency of the lighting device may be improved, a user may obtain a uniform white lighting effect, and high power efficiency may be achieved.

According to another embodiment, in the light extraction structure 1, when the second scattering degree by the second scattering S2 is greater than the first scattering degree by the first scattering S1, the average total transmittance of the base substrate 101, that is, the light extraction structure 1, with respect to the wavelength of the light may be less than 70%. In this case, the average total reflectance of the base substrate 101 with respect to the wavelength of the light may be 20% or more.

As such, in the light extraction structure 1, when the second scattering degree by the second scattering S2 is greater than the first scattering degree by the first scattering S1, the transparency is relatively low and the reflectance is relatively high. However, an average light diffusion value for the wavelength of light may be about 80% or more, and thus, high diffusivity may be obtained. In addition, a change in luminance according to a viewing angle may be reduced, and thus, an effect close to Lambertian emission may be obtained, and a change in color coordinates according to the viewing angle may also be reduced. Therefore, when the light extraction structure 1 is attached to a lighting device, the light extraction efficiency of the lighting device may be improved, a user may obtain a uniform white lighting effect, and power efficiency may be increased.

When the first scattering degree by the first scattering S1 is greater than the second scattering degree by the second scattering S2, a light diffusion value of the light extraction structure 1 may decrease in a first angle of slope as the wavelength of the light increases. When the second scattering degree by the second scattering S2 is greater than the first scattering degree by the first scattering S1, the light diffusion value of the light extraction structure 1 may decrease in a second angle of slope as the wavelength of the light increases. In this case, the second angle may be greater than the first angle. Therefore, in the light extraction structure 1, an average light diffusion value according to the wavelength of light is higher when the first scattering degree by the first scattering S1 is greater than the second scattering degree by the second scattering S2 than when the second scattering degree by the second scattering S2 is greater than the first scattering degree by the first scattering S2. That is, in terms of light diffusion, the light extraction structure 1 may exhibit relatively superior characteristics when the first scattering degree by the first scattering S1 is greater than the second scattering degree by the second scattering S2 than when the second scattering degree by the second scattering S2 is greater than the first scattering degree by the first scattering S2. However, as described above, even when the first scattering degree by the first scattering S1 is greater than the second scattering degree by the second scattering S2, the light extraction structure 1 may obtain a light diffusion value sufficient for use in a lighting device and may reduce changes in luminance and color coordinates for each angle, and thus, may exhibit optical characteristics as a lighting application.

In the light extraction structure 1 according to an embodiment, when the first scattering degree by the first scattering S1 is greater than the second scattering degree by the second scattering S2, the pores 102 may have a first diameter, and when the second scattering degree by the second scattering S2 is greater than the first scattering degree by the first scattering S1, the pores 102 may have a second diameter. In this case, the first diameter may be greater than the second diameter.

In the light extraction structure 1 according to another embodiment, when the first scattering degree by the first scattering S1 is greater than the second scattering degree by the second scattering S2, the surface roughness of at least one of the first surface 11 or the second surface 12 may be a first roughness, and when the second scattering degree by the second scattering S2 is greater than the first scattering degree by the first scattering S1, the surface roughness of at least one of the first surface 11 or the second surface 12 may be a second roughness. In this case, the second roughness may be greater than the first roughness.

When the first scattering degree by the first scattering S1 is greater than the second scattering degree by the second scattering S2, the sizes of the pores 102 may have a greater influence on the first scattering S1. According to an embodiment, when the first scattering degree by the first scattering S1 is greater than the second scattering degree by the second scattering S2, the pores 102 may have radii of 0.5 μm or more. In this case, the radii of the pores 102 may be radii based on a long axis. More specifically, the pores 102 may have radii of 1 μm or more. In this case, the surface roughness of at least one of the first surface 11 and the second surface 12 may be 20 nm or less based on rms standard. As such, when the first scattering degree by the first scattering S1 is greater than the second scattering degree by the second scattering S2, the surface roughness of at least one of the first surface 11 or the second surface 12 may not have a great influence on the optical characteristics of the light extraction structure 1. Therefore, in the light extraction structure 1 according to an embodiment, when the first scattering degree by the first scattering S1 is designed to be greater than the second scattering degree by the second scattering S2, the pores 102 may be designed to have radii of 0.5 μm or more.

In the light extraction structure 1 according to another embodiment, when the second scattering degree by the second scattering S2 is greater than the first scattering degree by the first scattering S1, the surface roughness of at least one of the first surface 11 or the second surface 12 may have a greater influence on the first scattering S1. According to another embodiment, when the first scattering degree by the first scattering S1 is greater than the second scattering degree by the second scattering S2, the surface roughness of at least one of the first surface 11 or the second surface 12 may be 50 nm or more based on rms standard. In this case, the pores 102 may have radii of 1 μm or less. Specifically, the pores 102 may have radii of 0.5 μm or less. As such, when the second scattering degree by the second scattering S2 is greater than the first scattering degree by the first scattering S1, the sizes of the pores 102 may not have a great influence on the optical characteristics of the light extraction structure 1. Therefore, in the light extraction structure 1 according to an embodiment, when the second scattering degree by the second scattering S2 is designed to be greater than the first scattering degree by the first scattering S1, the surface roughness of at least one of the first surface 11 or the second surface 12 may be designed to be 50 nm or more based on rms.

Figure 2:
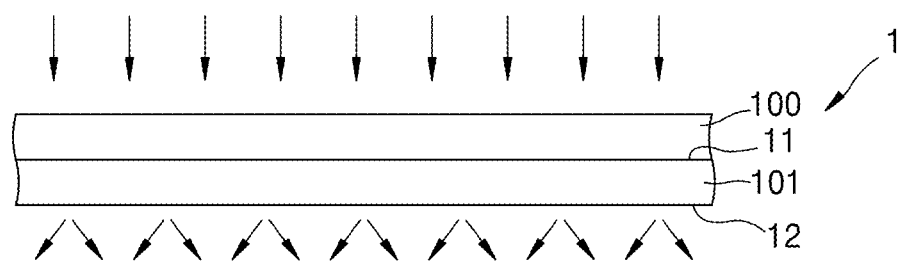
FIG. 2 is a schematic cross-sectional view of a light extraction structure according to another embodiment.

The light extraction structure 1 according to the embodiments as described above may have a single film shape, as shown in FIG. 1. However, the present disclosure is not limited thereto, and the light extraction structure 1 may further include a base 100 positioned adjacent to the first surface 11, as shown in FIG. 2. The base 100 may function as a support for forming the base substrate 101 in the manufacturing process of the base substrate 101. The base 100 may have a substrate and/or film shape, may be rigid or flexible, and may include a light transmissive glass material or polymer material.

Figure 3:
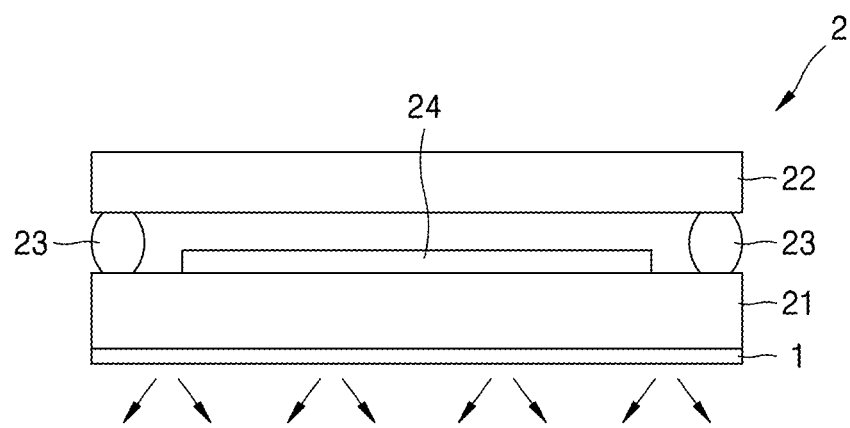
FIG. 3 is a schematic cross-sectional view of an organic electroluminescent lighting device according to another embodiment.

FIG. 3 is a schematic cross-sectional view of an organic electroluminescent lighting device 2 according to another embodiment. According to the embodiment shown in FIG. 3, the organic electroluminescent lighting device 2 may include a substrate 21 and a sealing member 22 facing each other and an organic light-emitting portion 24 positioned therebetween. The substrate 21 and the sealing member 22 may be coupled to each other, and the organic light-emitting portion 24 positioned therebetween may be sealed by blocking outside air. According to the embodiment shown in FIG. 3, the sealing member 22 may have the shape of a substrate and coupled to the substrate 21 by a sealant 23 positioned at an edge thereof. However, the present disclosure is not limited thereto, and the sealing member 22 may include a thin film structure including at least one film. In this case, the sealing member 22 may be formed on the substrate 21 to cover the organic light-emitting portion 24.

The organic electroluminescent lighting device 2 according to the embodiment shown in FIG. 3 may be provided such that light emitted from the organic light-emitting portion 24 is emitted toward the substrate 21, and in this case, the light extraction structure 1 according to the embodiments described above may be coupled to the outer surface of the substrate 21. In this case, the light extraction structure 1 may be positioned such that the first surface 11 described above faces the substrate 21.

Figure 4:
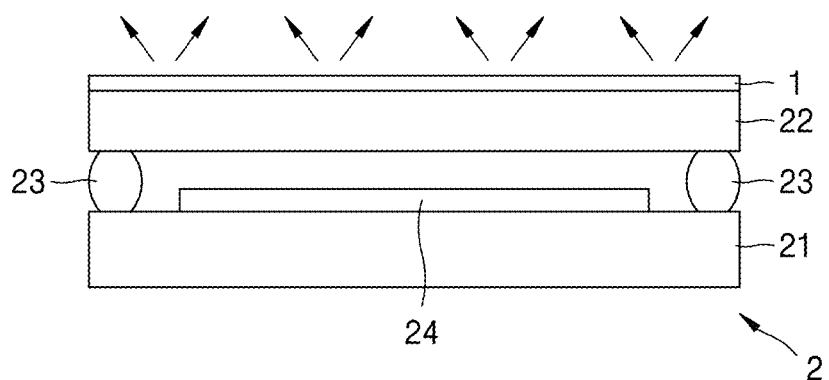
FIG. 4 is a schematic cross-sectional view of an organic electroluminescent lighting device according to another embodiment.

An organic electroluminescent lighting device 2 according to still another embodiment illustrated in FIG. 4 may be provided such that light emitted from an organic light-emitting portion 24 is emitted toward a sealing member 22, and in this case, the light extraction structure 1 according to the embodiments described above may be coupled to the outer surface of the sealing member 22. In this case, the light extraction structure 1 may be positioned such that the first surface 11 described above faces the sealing member 22.

Figure 5:
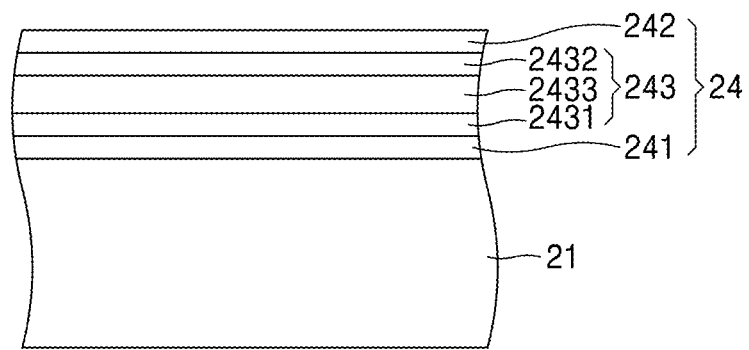
FIG. 5 is a partial cross-sectional view illustrating an embodiment of an organic light-emitting portion.

The organic light-emitting portion 24 may include an organic light-emitting device that emits white light. As shown in FIG. 5, the organic light-emitting portion 24 may include a first electrode 241 formed on a substrate 21, a second electrode 242 facing the first electrode 241, and an organic layer 243 between the first electrode 241 and the second electrode 242.

The first electrode 241 and the second electrode 242 may act as an anode and a cathode, respectively, but polarities thereof may be reversed.

When the first electrode 241 acts as an anode, the first electrode 241 may include a conductor having a high work function, and when the first electrode 241 acts as a cathode, the first electrode 241 may include a conductor having a low work function. When the second electrode 242 acts as a cathode, the second electrode 242 may include a conductor having a low work function, and when the second electrode 242 acts as an anode, the second electrode 242 may include a conductor having a high work function. A transparent conductive oxide such as ITO, $In_2O_3$, ZnO, or IZO, or a noble metal such as Au may be used as the conductor having a high work function. Ag, Al, Mg, Li, Ca, LiF/Ca, LiF/Al, etc. may be used as the conductor having a low work function.

In the bottom emission type structure shown in FIG. 3, the first electrode 241 may be of a light transmission type, and the second electrode 242 may include a light reflector.

To this end, when the first electrode 241 acts as an anode, the first electrode 241 is formed by depositing ITO, IZO, ZnO, $In_2O_3$, or the like having a high work function. In addition, when the first electrode 241 acts as a cathode, the first electrode 241 may be thinly formed to be a translucent film including Ag, Al, Mg, Li, Ca, LiF/Ca, LiF/Al, or the like having a low work function.

When the second electrode 242 acts as a cathode, the second electrode 242 may be formed to be a reflective film including metal such as Li, Ca, LiF/Ca, LiF/Al, Al, Mg, or Ag.

When the second electrode 242 acts as an anode, the second electrode 242 is formed by depositing ITO, IZO, ZnO, $In_2O_3$, or the like.

In the top emission type structure shown in FIG. 4, the first electrode 241 may includes a light reflector, and the second electrode 242 may be a light transmission type.

To this end, when the first electrode 241 acts as an anode, the first electrode 241 is formed by forming a reflector including Ag, Mg, Al, Pt, Pd, Au, Ni, Nd, Jr, Cr, or a compound thereof and depositing, on the reflector, ITO, IZO, ZnO, $In_2O_3$ or the like having a high work function. When the first electrode 241 acts as a cathode, the first electrode 241 is formed of Ag, Al, Mg, Li, Ca, LiF/Ca, LiF/Al, or the like having a low work function and capable of light reflection.

When the second electrode 242 acts as a cathode, the second electrode 242 may be thinly formed to be a translucent film including metal such as Li, Ca, LiF/Ca, LiF/Al, Al, Mg, or Ag having a low work function. A transparent conductor such as ITO, IZO, ZnO, or $In_2O_3$ may be formed on the translucent film including metal to compensate for the problem of high resistance due to the thin thickness of the translucent film. When the second electrode 242 acts as an anode, the second electrode 242 is formed by depositing ITO, IZO, ZnO, $In_2O_3$, or the like.

The organic layer 243 may include a first organic layer 2431, a second organic layer 2432, and an emission layer 2433 therebetween.

The first organic layer 2431 and the second organic layer 2432 are used to promote the flow of holes and electrons from the anode and the cathode. When the first electrode 241 is an anode, the first organic layer 2431 may include a hole injection/transport layer and/or an electron blocking layer and the second organic layer 2432 may include an electron injection/transport layer and/or a hole blocking layer. In addition, when the first electrode 241 is a cathode, the first organic layer 2431 may include an electron injection/transport layer and/or a hole blocking layer and the second organic layer 225 may include a hole injection/transport layer and/or an electron blocking layer.

The emission layer 2433 may be formed by using a single organic compound capable of emitting white light, or by stacking two or more organic emission layers having different colors.

In the case of forming the emission layer 2433 by stacking two or more organic emission layers, the emission layer 2433 may be formed by sequentially stacking a red emission layer, a green emission layer, and a blue emission layer, or may be formed by stacking a sky blue layer on a red and green-mixed layer.

A method of achieving white light emission may be variously applied.

The organic light-emitting portion 24 as described above may have a plurality of pixels, but is not limited thereto and may be provided as a surface emitting type of a single pixel.

In the organic electroluminescent lighting device 2 as described above, the light extraction structure 1 may improve light extraction efficiency for light emitted from the organic light-emitting portion 24, as described above, obtain a uniform white lighting effect, and improve power efficiency.

The organic electroluminescent lighting device 2 may be manufactured by directly forming the base substrate 101 of the light extraction structure 1 as shown in FIG. 1 on the surface of the substrate 21 or the sealing member 22. However, the present disclosure is not limited thereto, and the light extraction structure 1 illustrated in FIG. 1 may be attached to the substrate 21 or the sealing member 22 by using a separate adhesive member and/or a bonding method. In addition, in the light extraction structure 1 illustrated in FIG. 2, the base 100 may be attached to the substrate 21 or the sealing member 22 by using a separate adhesive member and/or a bonding method.

A more detailed embodiment of the light extraction structure 1 as described above is described below.

A coating composition solution is prepared.

According to an embodiment, the coating composition solution may include a colorless polyamic acid.

The coating composition solution may be made by mixing 4,4'-oxydiphthalic anhydride and 2,2-bis[4-(4-aminophenoxy)phenyl] in DMAc solvent at a 1:1 molar ratio, stirring the mixture for 24 hours, and then diluting the mixture with 3 wt % DMAc solvent.

Next, the coating composition solution is coated on a base. The base may be the base 100 as shown in FIG. 2, but is not limited thereto and may be the substrate 21 and/or the sealing member 22 as shown in FIGS. 3 and 4.

The base coated with the coating composition solution is put in a solvent for forming pores.

Polar protic solvents may be used as the solvent for forming pores, and the solvent for forming pores may include alcohol.

In a first embodiment of an experiment, de-ionized water (DIW) 100% was used as the solvent for forming the pores. In a second embodiment of the experiment, a mixture in which the ratio of deionized water to ethanol is 50%:50% was used as the solvent for forming the pores. In a third embodiment of the experiment, ethanol 100% was used as the solvent for forming the pores.

A polyimide-based base substrate, that is, the base substrate 101, was formed through thermal drying at 170° C. in the first to third embodiments.

Figure 6:
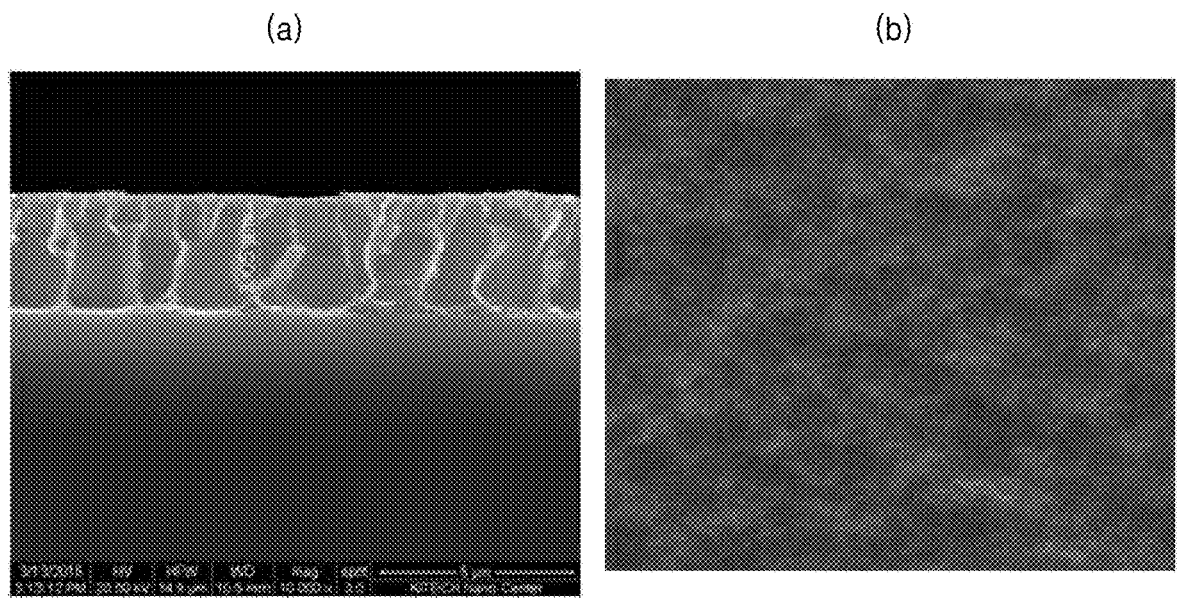
FIG. 6 shows a cross-sectional scanning electron microscope (SEM) picture (a) and a surface SEM picture (b) of a film formed according to a first embodiment.
Figure 7:
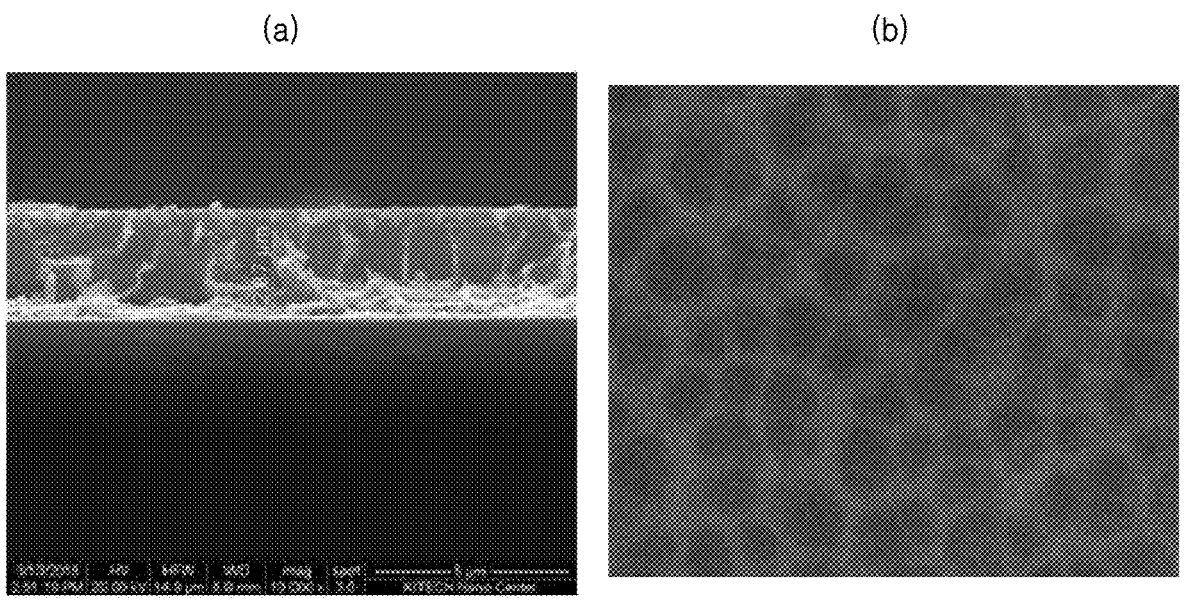
FIG. 7 shows a cross-sectional SEM picture (a) and a surface SEM picture (b) of a film formed according to a second embodiment.
Figure 8:
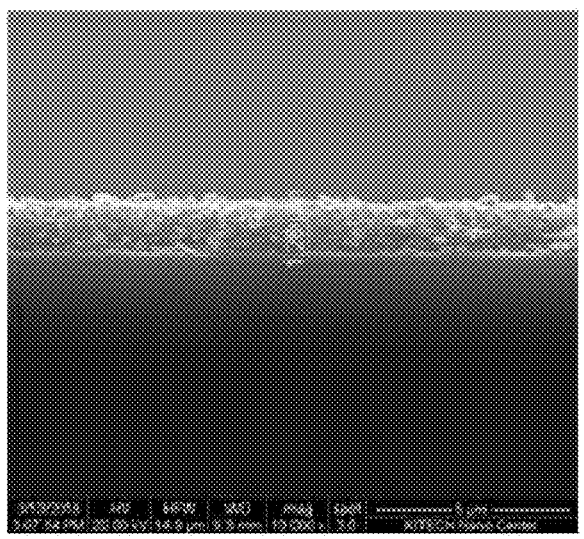
FIG. 8 shows a cross-sectional SEM picture (a) and a surface SEM picture (b) of a film formed according to a third embodiment.
Figure 8:
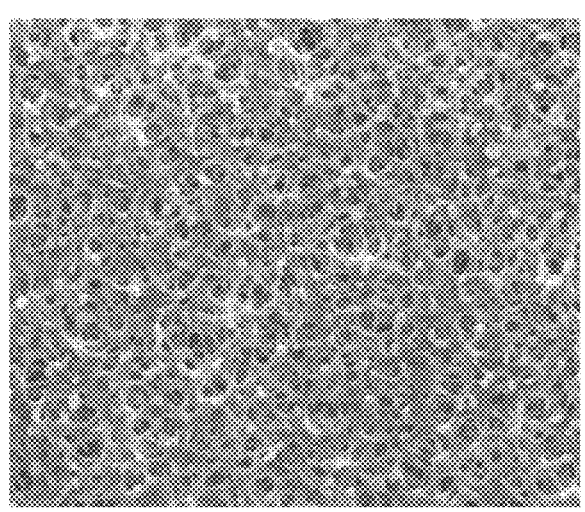

FIGS. 6(a) and 6(b) are a cross-sectional scanning electron microscope (SEM) picture and a surface SEM picture, respectively, of a film formed according to the first embodiment, FIGS. 7(a) and 7(b) are a cross-sectional SEM picture and a surface SEM picture, respectively, of a film formed according to the second embodiment, and FIGS. 8(a) and 8(b) are a cross-sectional SEM picture and a surface SEM picture, respectively, of a film formed according to the third embodiment.

The thickness of the film (that is, the base substrate 101) formed according to the first embodiment is about 3.1 μm, the thickness of the film formed according to the second embodiment is about 2.9 μm, and the thickness of the film formed according to the third embodiment is about 1.3 μm. As such, it may be seen that the thickness of the film formed according to the first embodiment is greater than that of the film formed according to the third embodiment, with respect to films having the same composition.

The maximum size (based on a long axis) of a pore in the film formed according to the first embodiment is about 3 μm, the maximum size of a pore in the film formed according to the second embodiment is about 1.6 μm, and the maximum size of a pore in the film formed according to the third embodiment is about 1.3 μm. It may be seen that the pore size in the first embodiment is significantly greater than that in the third embodiment.

The surface roughness (based on rms) is about 3.6 nm in the first embodiment, about 17 nm in the second embodiment, and about 68 nm in the third embodiment. It may be seen that the surface roughness in the third embodiment is significantly greater than that in the first embodiment.

Figure 9:
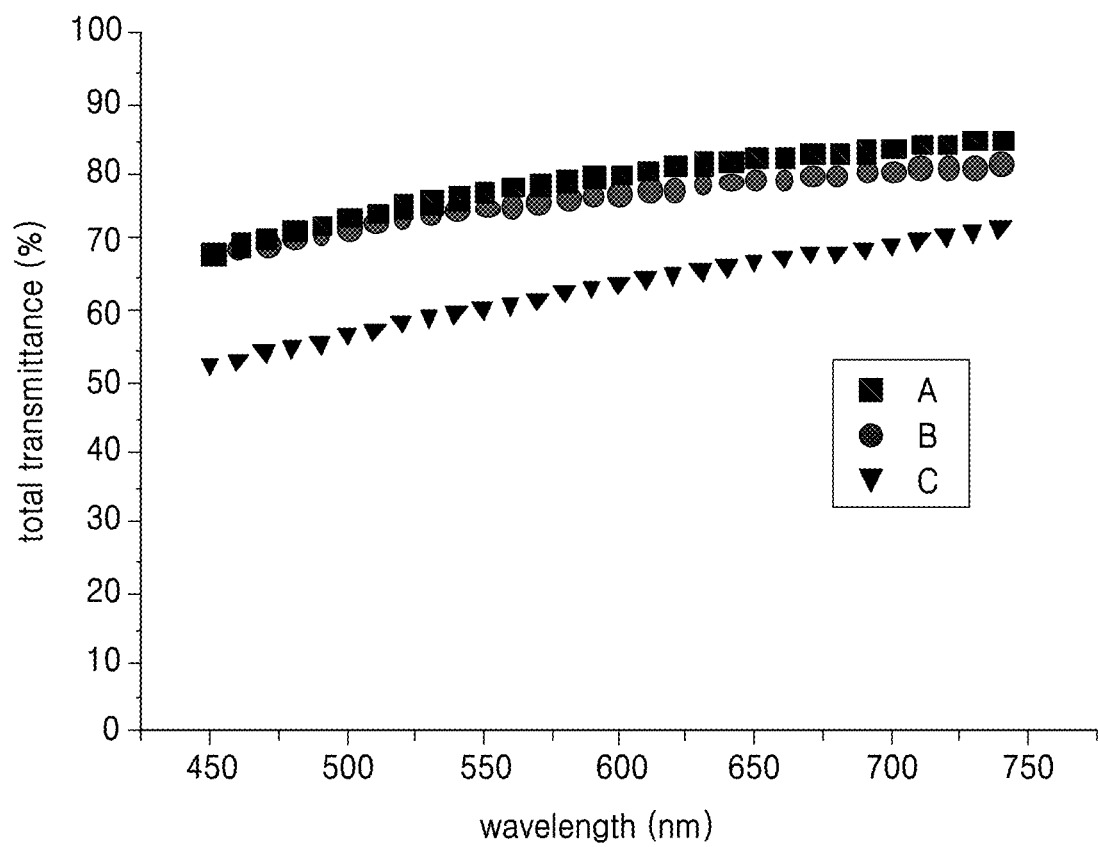
FIG. 9 is a graph showing total transmittance according to the wavelength band of a visible light region, according to a first embodiment A, a second embodiment B, and a third embodiment C.

FIG. 9 is a graph showing total transmittance according to the wavelength band of a visible light region, according to a first embodiment A, a second embodiment B, and a third embodiment C. As shown in FIG. 9, it may be seen that the first embodiment A shows the highest total transmittance and the third embodiment C shows the lowest total transmittance.

The first embodiment A shows an average total transmittance of about 74%. In this case, the average total reflectance of the first embodiment A is 15%.

The second embodiment B shows an average total transmittance of about 73%. In this case, the average total reflectance of the second embodiment B is 15%.

The third embodiment C shows an average total transmittance of about 59%. In this case, the average total reflectance of the third embodiment C is 26%.

Figure 10:
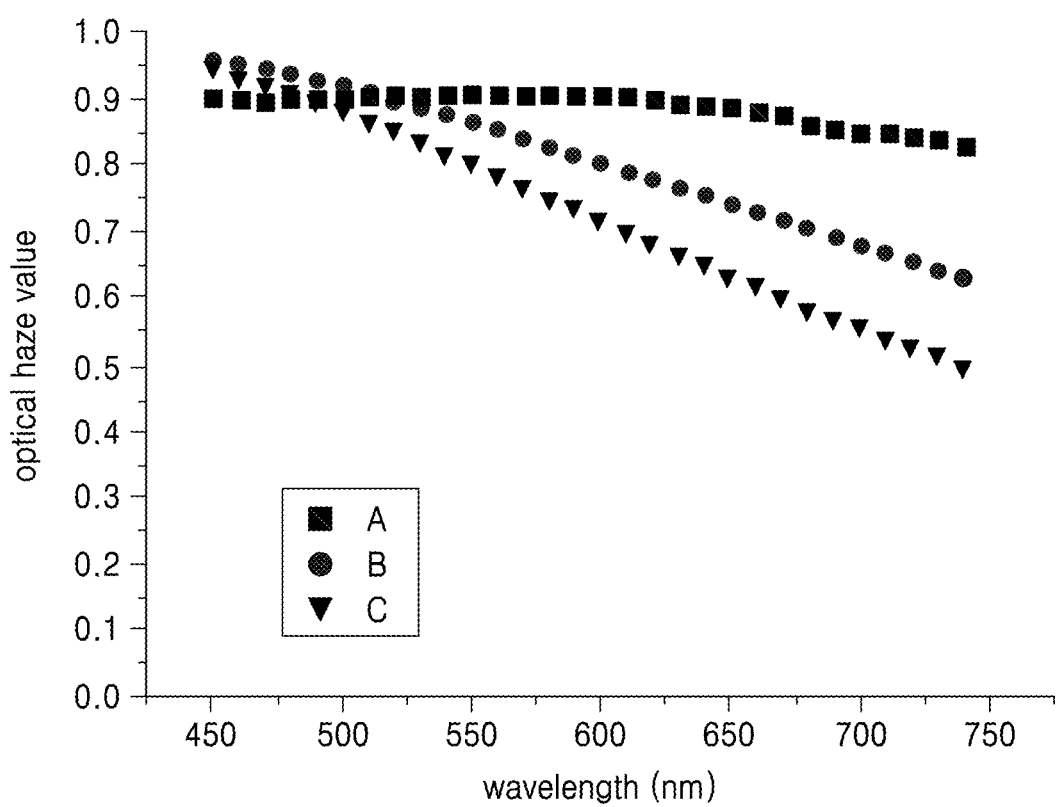
FIG. 10 is a graph showing an optical haze value according to the wavelength band of a visible light region, according to the first embodiment A, the second embodiment B, and the third embodiment C.

FIG. 10 is a graph showing an optical haze value according to the wavelength band of a visible light region, according to the first embodiment A, the second embodiment B, and the third embodiment C.

As shown in FIG. 10, a light diffusion value of the first embodiment A decreases with a gentle angle as a wavelength increases, and a light diffusion value of the second embodiment B decreases with an angle, which is steeper than the gentle angle, as the wavelength increases. A light diffusion value of the third embodiment C decreases with the steepest angle as the wavelength increases. Accordingly, the total average light diffusion value also decreases from the first embodiment A to the third embodiment C. However, each of the first to third embodiments A to C shows an average light diffusion value of about 80% or more.

A light extraction structure formed in this manner is installed in the organic electroluminescent lighting device 2 as shown in FIGS. 3 and 5. A glass having a thickness of 700 μm is used for the substrate 21, an indium tin oxide (ITO) layer having a thickness of 150 nm is used for the first electrode 241, and an aluminum layer having a thickness of 200 nm is used for the second electrode 242. The first organic layer 2431 has a structure in which an $MoO_3$ layer having a thickness of 1 nm and a CBP layer having a thickness of 45 nm are sequentially stacked, and the second organic layer 2432 has a structure in which a Bphen layer having a thickness of 45 nm and an LiF layer having a thickness of 1 nm are sequentially stacked. A CBP layer (Ir(ppy)2(acac)) having a thickness of 15 nm is used as the emission layer 2433.

Figure 11:
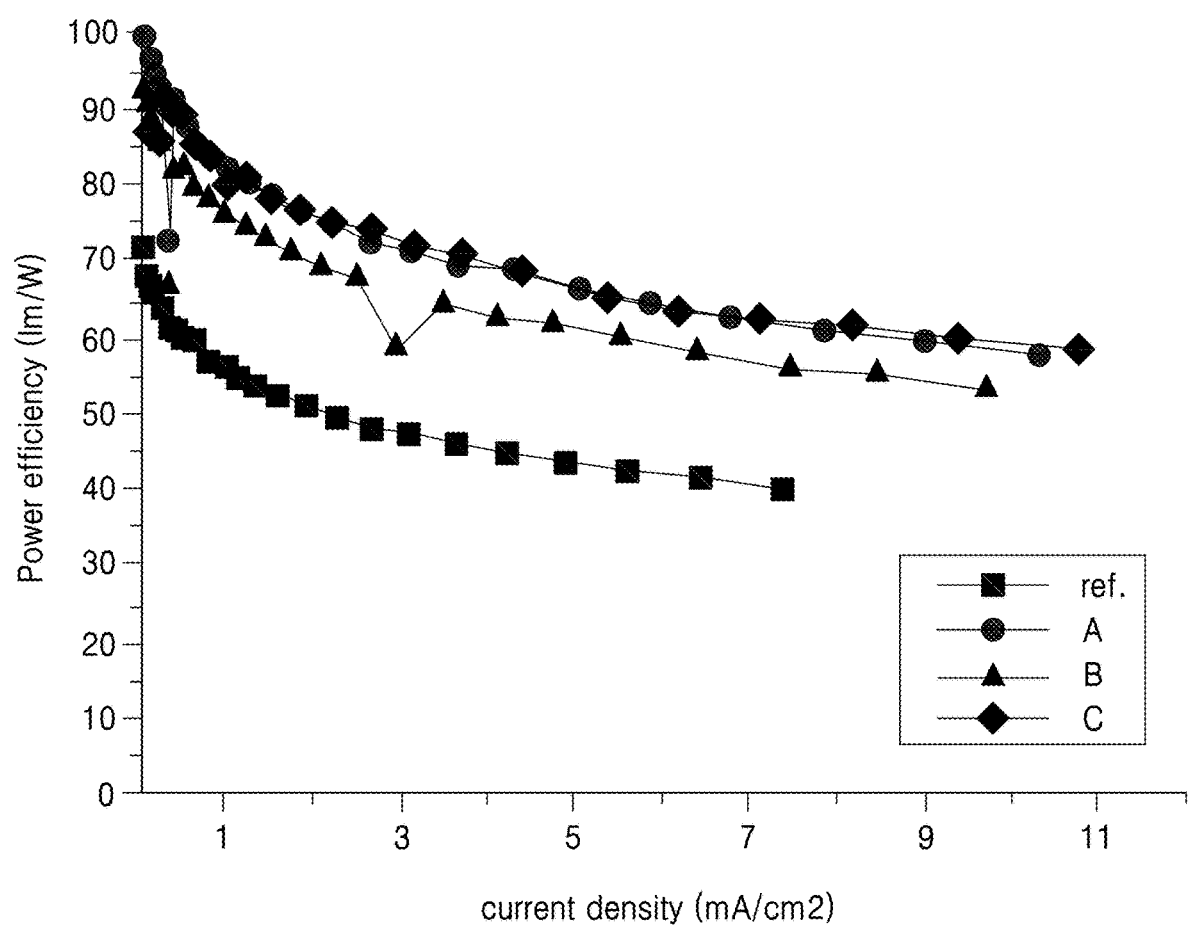
FIG. 11 is a graph showing a power efficiency comparison between the first to third embodiments A to C and the comparison example ref.

FIG. 11 is a graph showing a power efficiency comparison between the first to third embodiments A to C applied to the organic electroluminescent lighting device 2 and a comparison example ref. In the comparative example ref, a light extraction structure is not used.

As shown in FIG. 11, it may be seen that the first embodiment A to the third embodiment C have very high power efficiency compared to the comparative example ref.

Figure 12:
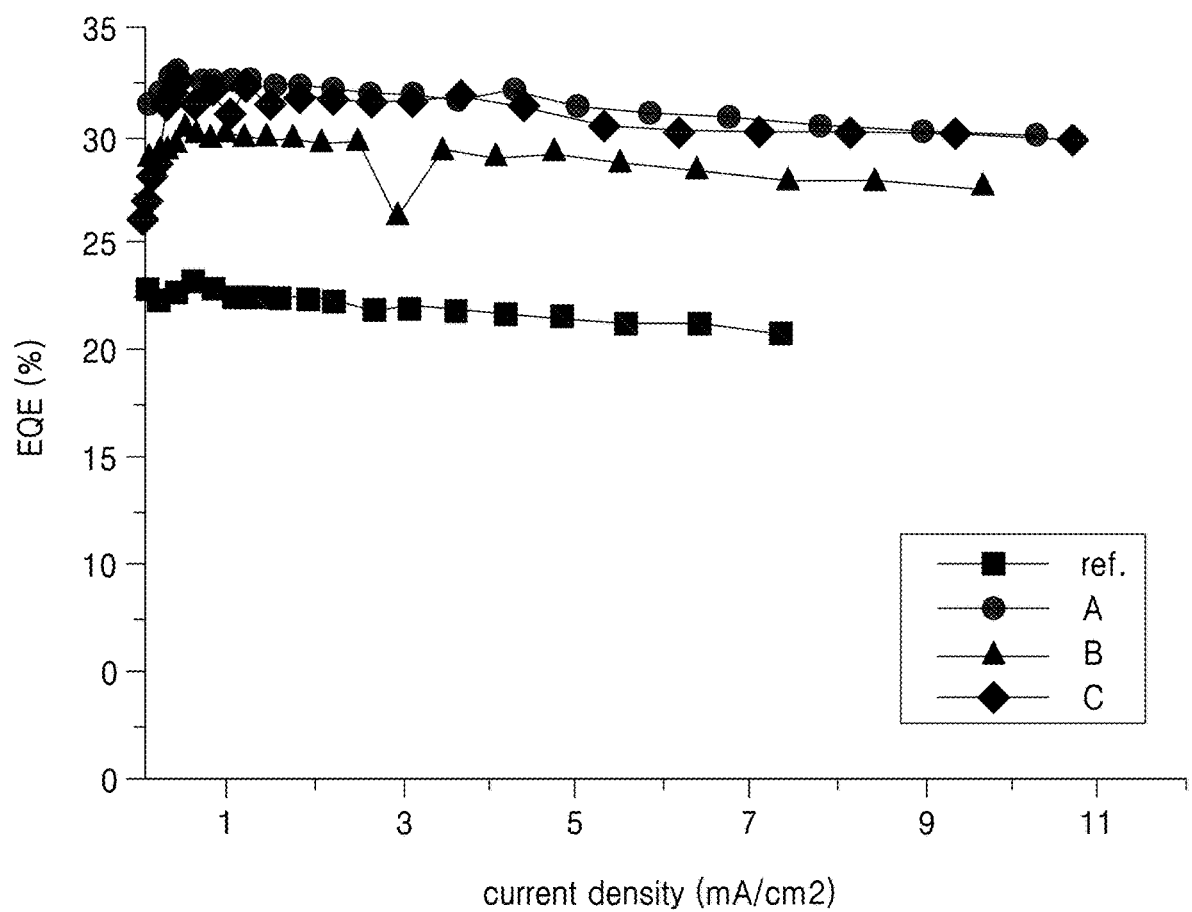
FIG. 12 is a graph showing an external quantum efficiency (EQE) comparison between the first to third embodiments A to C and the comparison example ref.

FIG. 12 is a graph showing an external quantum efficiency (EQE) comparison between the first to third embodiments A to C and the comparison example ref. As shown in FIG. 12, it may be seen that the first embodiment A to the third embodiment C have very high external quantum efficiency compared to the comparative example ref.

Figure 13:
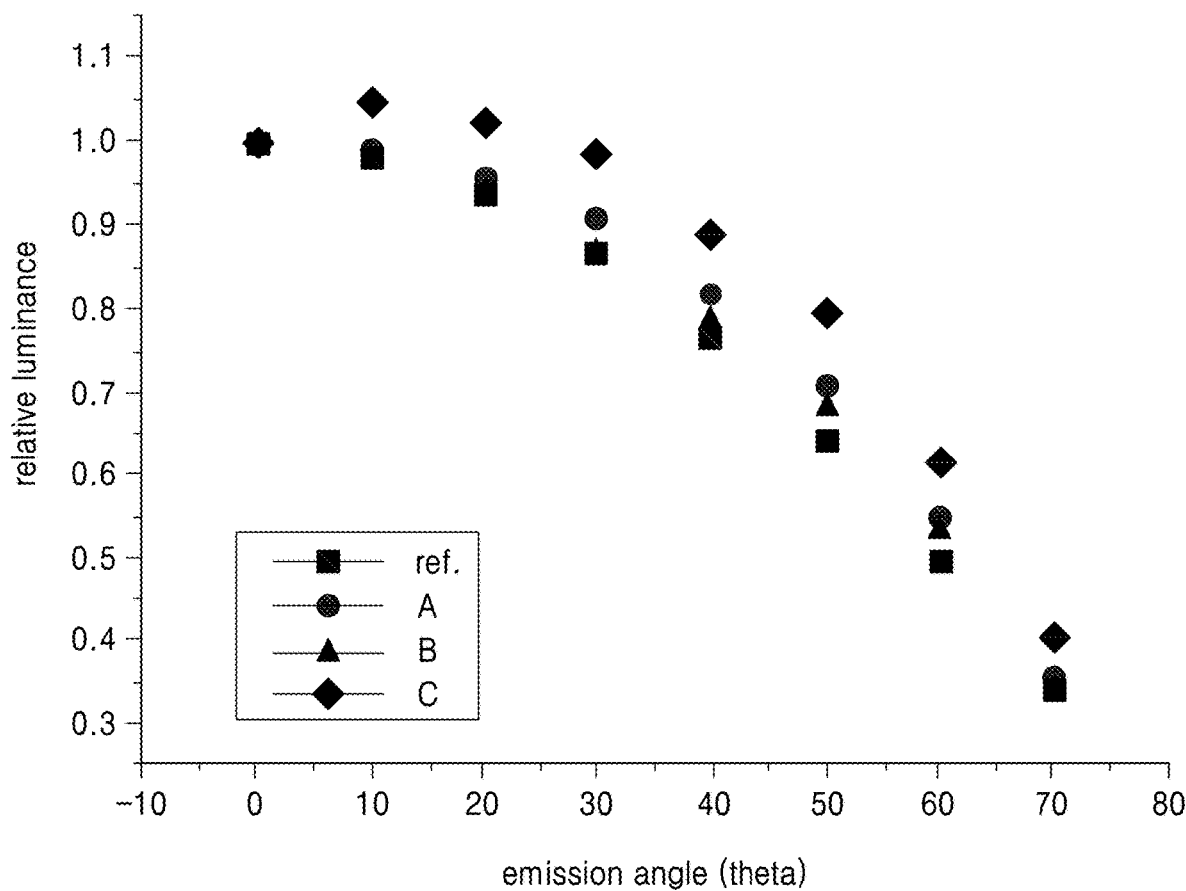
FIG. 13 is a graph showing a change in relative luminance for each emission angle.
Figure 14:
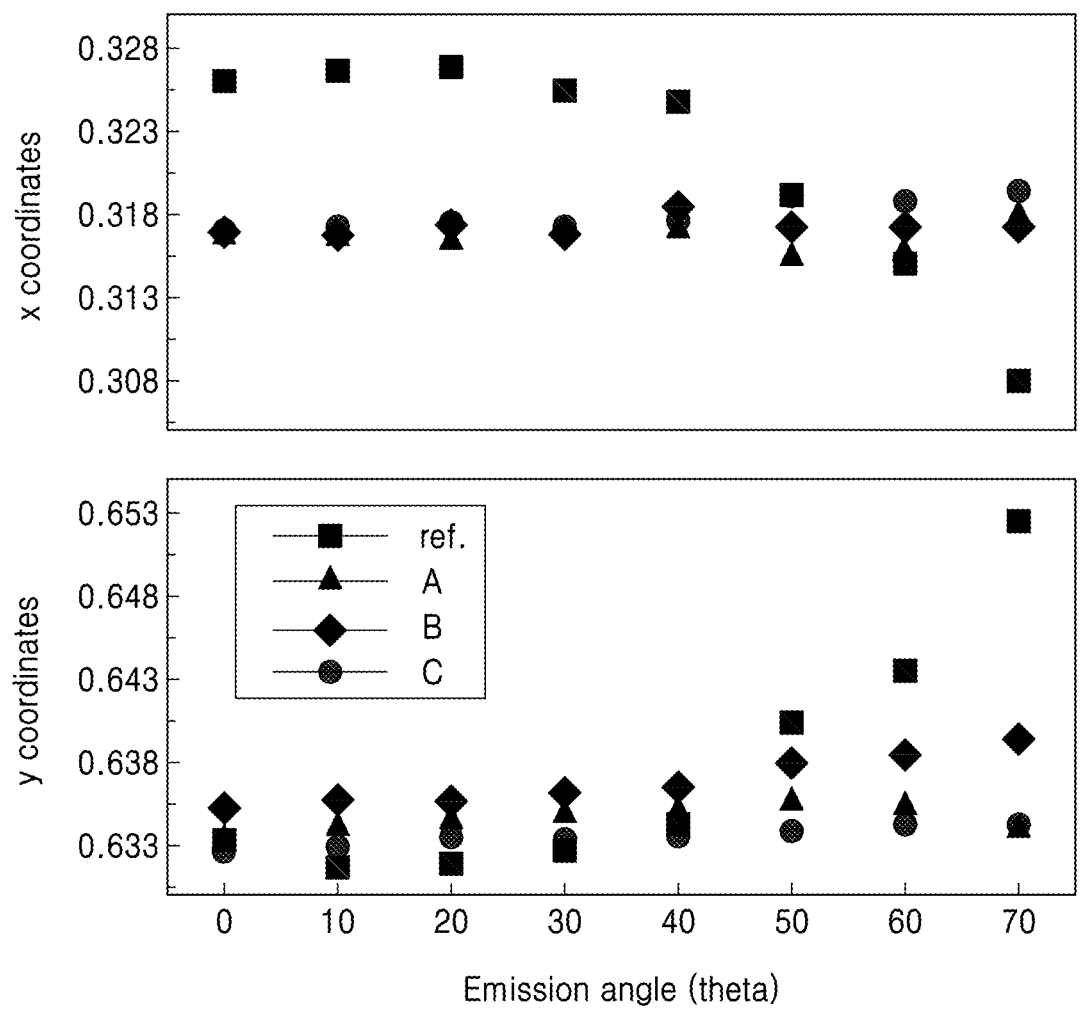
FIG. 14 is a graph showing a change in color coordinates for each emission angle.

FIG. 13 is a graph showing a change in relative luminance for each emission angle, and FIG. 14 is a graph showing a change in color coordinates for each emission angle.

As shown in FIG. 13, it may be seen that the first embodiment A and the second embodiment B draw a curve close to Lambert emission. However, it may be seen that the third embodiment C shows a form in which the luminance increases in a lateral direction of the lighting device. Therefore, the first embodiment A and the second embodiment B may obtain a uniform lighting effect, and the third embodiment C may obtain a lighting effect with enhanced lateral luminance.

As shown in FIG. 14, the first to third embodiments A to C have a smaller color coordinate change according to the angle than the comparative example ref, and thus, a user may obtain a uniform white lighting effect irrespective of the angle.

The first embodiment A and the second embodiment B described above may correspond to the case where the first scattering degree by the first scattering S1 is greater than the second scattering degree by the second scattering S2. The third embodiment C may correspond to the case where the second scattering degree by the second scattering S2 is greater than the first scattering degree by the first scattering S1. As described above, the first embodiment A and the second embodiment B show higher optical characteristics. The third embodiment C also shows higher optical characteristics than the comparative example ref and thus is sufficiently applicable to a lighting device. Thus, according to the present disclosure, the light extraction efficiency of illumination may be improved by using an optical difference sufficient to be used as the illumination, and desired optical characteristics may be realized and power efficiency may be improved.

While this present disclosure has been described with reference to embodiments shown in the drawings, it will be understood by those of ordinary skill in the art that various changes in form and details may be made therein. Therefore, the scope of the present disclosure will be defined by the technical ideas of the appended claims.

INDUSTRIAL APPLICABILITY

The light extraction structure in the present disclosure may be used as an optical film and may be applied to an organic electroluminescent lighting device.

The invention claimed is:

1. A structure for extracting light, the structure comprising:
   a base substrate having a first surface and a second surface opposed to each other, the base substrate being provided such that light enters the first surface and exits through the second surface; and
   a plurality of pores irregularly distributed in the base substrate,
   wherein the base substrate scatters the light when the light passes through the base substrate,
   wherein the scattering comprises a first scattering by the pores and a second scattering by a surface roughness of the second surface,
   wherein a first scattering degree by the first scattering and a second scattering degree by the second scattering have a relative difference,
   wherein, when the first scattering degree by the first scattering is greater than the second scattering degree by the second scattering, the pores have radii of 0.5 μm or more, and the surface roughness is configured to have a less influence on optical characteristics than the pores, and
   wherein, when the second scattering degree by the second scattering is greater than the first scattering degree by the first scattering, the surface roughness is 50 nm or more based on rms, and the pores are configured to have a less influence on the optical characteristics than the surface roughness.

2. The structure of claim 1, wherein, when the first scattering degree by the first scattering is greater than the second scattering degree by the second scattering, average total transmittance of the base substrate with respect to a wavelength of the light is 70% or more.

3. The structure of claim 1, wherein, when the second scattering degree by the second scattering is greater than the first scattering degree by the first scattering, average total transmittance of the base substrate with respect to a wavelength of the light is less than 70%.

4. The structure of claim 1, wherein,
   when the first scattering degree by the first scattering is greater than the second scattering degree by the second scattering, the pores have a first diameter, and
   when the second scattering degree by the second scattering is greater than the first scattering degree by the first scattering, the pores have a second diameter,
   wherein the first diameter is greater than the second diameter.

5. The structure of claim 1, wherein,
   when the first scattering degree by the first scattering is greater than the second scattering degree by the second scattering, at least one of the first surface and the second surface has a first roughness, and
   when the second scattering degree by the second scattering is greater than the first scattering degree by the first scattering, at least one of the first surface and the second surface has a second roughness, wherein the second roughness is greater than the first roughness.

6. An organic electroluminescent lighting device comprising:
- a substrate;
- a sealing member coupled to the substrate;
- an organic light-emitting portion between the substrate and the sealing member and sealed by the substrate and the sealing member; and
- a light extraction film positioned at a side from which light emitted from the organic light-emitting portion is taken out, the light extraction film including a base substrate having a first surface and a second surface opposed to each other, and a plurality of pores irregularly distributed in the base substrate, wherein the base substrate is provided such that light enters the first surface and exits through the second surface, wherein the base substrate scatters the light when the light passes through the base substrate, wherein the scattering comprises a first scattering by the pores and a second scattering by a surface roughness of the second surface, and wherein a first scattering degree by the first scattering and a second scattering degree by the second scattering have a relative difference, wherein, when the first scattering degree by the first scattering is greater than the second scattering degree by the second scattering, the pores have radii of 0.5 μm or more, and the surface roughness is configured to have a less influence on optical characteristics than the pores, and wherein, when the second scattering degree by the second scattering is greater than the first scattering degree by the first scattering, the surface roughness is 50 nm or more based on rms, and the pores are configured to have a less influence on the optical characteristics than the surface roughness.

7. The organic electroluminescent lighting device of claim 6, wherein, when the first scattering degree by the first scattering is greater than the second scattering degree by the second scattering, light transmittance of the base substrate is 70% or more.

8. The organic electroluminescent lighting device of claim 6, wherein, when the second scattering degree by the second scattering is greater than the first scattering degree by the first scattering, light transmittance of the base substrate is less than 70%.

9. The organic electroluminescent lighting device of claim 6, wherein,
- when the first scattering degree by the first scattering is greater than the second scattering degree by the second scattering, the pores have a first diameter, and
- when the second scattering degree by the second scattering is greater than the first scattering degree by the first scattering, the pores have a second diameter,
- wherein the first diameter is greater than the second diameter.

10. The organic electroluminescent lighting device of claim 6, wherein,
- when the first scattering degree by the first scattering is greater than the second scattering degree by the second scattering, at least one of the first surface and the second surface has a first roughness, and
- when the second scattering degree by the second scattering is greater than the first scattering degree by the first scattering, at least one of the first surface and the second surface has a second roughness,
- wherein the second roughness is greater than the first roughness.

* * * * *